(12) United States Patent
Lu et al.

(10) Patent No.: US 7,277,281 B1
(45) Date of Patent: Oct. 2, 2007

(54) HEAT DISSIPATION DEVICE HAVING WIRE FIXTURE

(75) Inventors: Cui-Jun Lu, Shenzhen (CN); Jin-Song Feng, Shenzhen (CN); Qiao Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,837

(22) Filed: May 12, 2006

(51) Int. Cl.
*H05K 7/20* (2006.01)

(52) U.S. Cl. ............... 361/695; 361/697; 361/700; 174/135; 174/72 A; 439/67; 439/247; 439/485; 439/487; 415/213.1; 415/214.1; 165/104.33; 165/104.21; 165/80.3; 165/80.4

(58) Field of Classification Search ............... 361/697, 361/695, 710, 752; 174/61, 54, 40 CC; 24/16 R, 24/129; 439/246–248, 378, 485, 501, 67, 439/487; 165/80.3, 104.33, 80.4; 454/184; 257/E23.099, 718, 719, 722; 248/510; 415/213.1, 415/175, 178
See application file for complete search history.

(56) References Cited

U.S. PATENT DOCUMENTS

| | | | | |
|---|---|---|---|---|
| 5,562,410 A | * | 10/1996 | Sachs et al. ............ | 415/213.1 |
| 6,062,872 A | * | 5/2000 | Strange et al. ............ | 439/67 |
| 6,388,196 B1 | * | 5/2002 | Liu et al. ............ | 174/135 |
| 6,435,889 B1 | * | 8/2002 | Vinson et al. ............ | 439/247 |
| 6,663,416 B2 | * | 12/2003 | Huang et al. ............ | 439/485 |
| 6,951,446 B2 | * | 10/2005 | Hung ............ | 415/213.1 |
| 6,964,295 B1 | * | 11/2005 | Yu et al. ............ | 165/104.33 |
| 6,989,988 B2 | * | 1/2006 | Arbogast et al. ............ | 361/695 |
| 7,033,206 B2 | * | 4/2006 | Chang et al. ............ | 439/485 |
| 2005/0225939 A1 | * | 10/2005 | Otsuki et al. ............ | 361/695 |
| 2006/0032616 A1 | * | 2/2006 | Yang ............ | 165/104.33 |
| 2006/0137861 A1 | * | 6/2006 | Wang et al. ............ | 165/104.33 |
| 2006/0268513 A1 | * | 11/2006 | Sheng et al. ............ | 361/695 |
| 2007/0035926 A1 | * | 2/2007 | Xia et al. ............ | 361/695 |

* cited by examiner

*Primary Examiner*—Boris Chèrvinsky
*Assistant Examiner*—Courtney Smith
(74) *Attorney, Agent, or Firm*—Jeffrey T. Knapp

(57) ABSTRACT

A heat dissipation device is for use in a computer enclosure, the computer enclosure having a group of wires (20) therein. The heat dissipation device includes a heat sink assembly. A wire fixture (60) is mounted on the heat sink assembly and configured for fixing the wires thereto. The wire fixture includes a mounting plate (62) positioned on the heat sink assembly. A bridge (624) projects from the mounting plate to form a receiving room (625) below the bridge. The wires are securely bound together via the wire fixture so as not to be loosened by vibration.

12 Claims, 3 Drawing Sheets

HEAT DISSIPATION DEVICE HAVING WIRE FIXTURE

FIELD OF THE INVENTION

The present invention relates generally to a heat dissipation device in a computer enclosure, and particularly to a heat dissipation device having a fan cover for attaching wires from the computer enclosure to the fan cover thereof.

DESCRIPTION OF RELATED ART

A group of power and signal wires is used as a common pathway among multiple devices in a computer enclosure to supply power and signals to the devices contained therein. If these wires are disorderly positioned in the computer enclosure they can create numerous problems. One problem is a blockage of air flow, which adversely effects heat-dissipation of the computer. Another problem is that customers also complain about the untidy appearance of the wires. So the wires should be securely bound together in a suitable manner so as not to be loosened by vibration.

There is, accordingly, a need to provide a device and system for securing wires in a manner which minimizes the current problems.

SUMMARY OF THE INVENTION

A heat dissipation device is used in a computer enclosure according to a preferred embodiment. The computer enclosure has a group of wires therein. The heat dissipation device includes a heat sink assembly. A wire fixture is mounted on the heat sink assembly and configured for fixing the wires thereto. The wire fixture includes a mounting plate positioned on the heat sink assembly. A bridge projects from the mounting plate to form a receiving room below the bridge. The wires are securely bound together in a suitable manner via the wire fixture so as not to be loosened by vibration.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
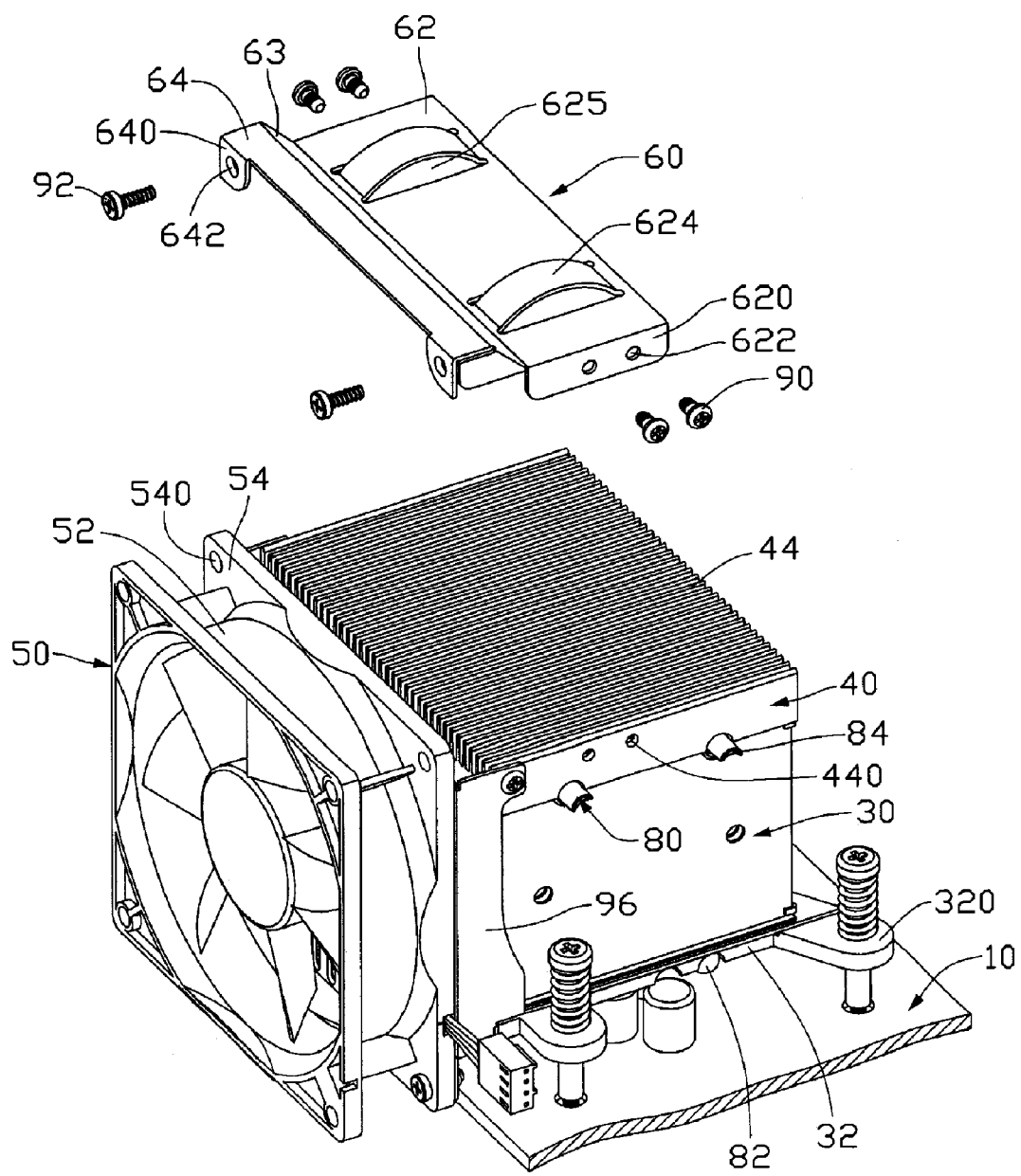
FIG. 1 is a partly exploded, isometric view of a heat dissipation device according to a preferred embodiment, wherein the heat dissipation device is mounted on a printed circuit board.
Figure 2:
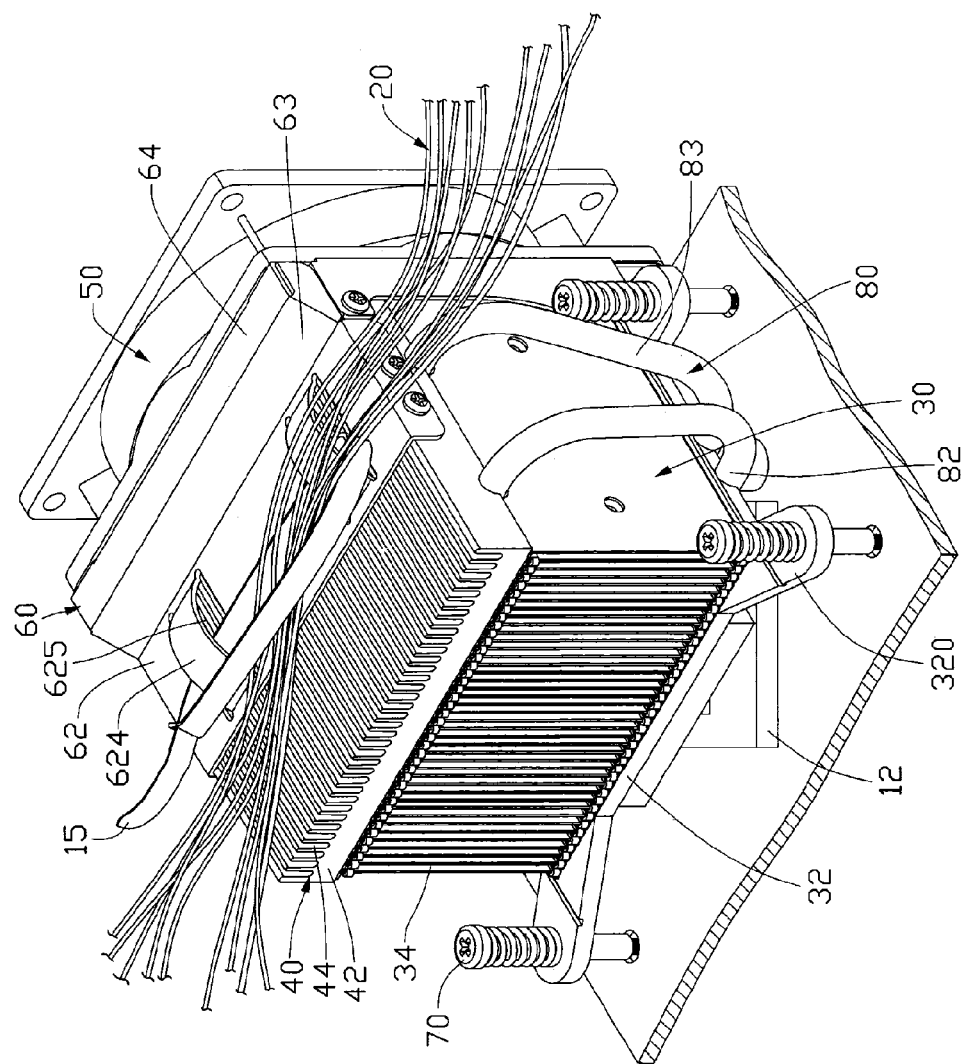
FIG. 2 is an assembled view of FIG. 1, but shown from another aspect.

Referring to FIGS. 1-2, a heat dissipation device in accordance with a preferred embodiment is mounted on a printed circuit board (PCB) 10 of a computer enclosure (not shown). A group of wires 20 extend from a power supply box (not shown) and connect to electronic devices (not shown) in the computer enclosure. The heat dissipation device comprise a main heat sink 30, an auxiliary heat sink 40 mounted on the main heat sink 30, a fan 50 and a fan cover 60. The main and auxiliary heat sink 30, 40 act as a heat sink assembly to dissipate heat from a CPU 12 mounted on the PCB 10. The fan cover 60 not only acts as a fan duct to guide an airflow flowing from the fan 50 to the heat sink assembly but also functions as a wire fixture to fix the wires 20 in the computer enclosure.

The main heat sink 30 comprises a heat spreader 32 and a plurality of fins 34 upwardly disposed on the heat spreader 32. The heat spreader 32 forms four ears 320, each of which extends outwardly from one of the four corners of the heat spreader 32. The heat spreader 32 thermally engages with the CPU 12 by extending four fasteners 70 through the four ears 320 to threadedly engage with a retainer (not shown) attached to a bottom side of the PCB 10. The auxiliary heat sink 40 is an aluminum extrusion type, and comprises a plate 42 parallel to the heat spreader 32 and mounted onto a top of the fins 34. A plurality of fins 44 upwardly extend from the plate 42. The fins 44 define a pair of threaded holes 440 in each of the two opposite outmost fins 44. A pair of parallel heat pipes 80 is engaged in the main heat sink 30 and the auxiliary heat sink 40. Each heat pipe 80 has a generally U-shaped configuration. The heat pipes 80 comprise evaporating portions 82, condensing portions 84 parallel to the evaporating portions 82 and adiabatic portions 83 perpendicularly interconnecting the evaporating portions 82 with the condensing portions 84. The evaporating portions 82 are received between the heat spreader 32 and a bottom of the fins 34 such that the evaporating portions 82 and the heat spreader 32 are thermally connected together, which means heat received by the spreader 32 is immediately transferred to the evaporating portions 82. The condensing portions 84 are received between the plate 42 and the top of the fins 34 such that the heat received by the evaporating portions 82 can be quickly transferred to the top of the fins 34 and the fins 44 of the auxiliary heat sink 40 via the condensing portions 84.

The fan 50 is positioned to a front side of the fins 34, 44 such that the airflow generated by the fan 50 can enter channels between the fins 34, 44. The channels extend along a front-to-rear direction. The fan 50 has a square configuration, and comprises a top portion 52 and four corners 54. The top portion 52 is above a top of the fins 44 of the auxiliary heat sink 40. Each corner 54 defines an aperture 540.

The fan cover 60 in accordance with a first preferred embodiment comprises a mounting plate 62, a faceplate 64 parallel to the mounting plate 62, and a baffle plate 63 obliquely interconnecting the mounting plate 62 and the faceplate 64. The mounting plate 62 is positioned on the top of the fins 44 of the auxiliary heat sink 40, and forms a pair of tabs 620 extending perpendicularly and downwardly from two opposite lateral ends thereof. Each tab 620 defines a pair of locating holes 622 corresponding to the threaded holes 440 of the auxiliary heat sink 40. The mounting plate 62 is mounted to the auxiliary heat sink 40 by extending screws 90 through the locating holes 622 to screw into the threaded holes 440 of the fins 44 of the auxiliary heat sink 40. A pair of arch shaped bridges 624 project from the mounting plate 62 towards direction away from the fins 44 to form receiving rooms 625 below the bridges 624. The receiving rooms 625 are defined between the bridges 624 and the top of the fins 44. Each bridge 624 has two opposite ends connected with the mounting plate 62. The bridge 624 is integrally stamped/pressed from the mounting plate 62. The faceplate 64 is located above the mounting plate 62 and forms a pair of tabs 640 extending perpendicularly and downwardly from two opposite front ends thereof. Each tab 640 of the faceplate 64 forms a hole 642 having internal threads, corresponding to an upper aperture 540 of the fan 50. The fan 50 is mounted to the main and auxiliary heat sink 30, 40 by extending screws 92 through the apertures 540 of the fan 50 to screw into the holes 642 of the tabs 640 of the faceplate 64. In addition, screws (not labeled) are used to extend through fan brackets 96 and screw into the fins 44 of the auxiliary heat sink 40.

The fan cover 60 is so configured as to block one portion of the airflow generated by the fan 50 from dissipating from the top of the fins 44 of the auxiliary heat sink 40, thus ensuring that the air flow can adequately blow to the fins 34, 44 to enhance the heat dissipating performance of the heat dissipation device. Furthermore, the fan cover 60 forms the arch shaped bridges 624 to collect the wires 20 via a tape 15 in the computer enclosure. The tape 15 passes through the receiving rooms 625 defined between the bridges 624 and the top of the fins 44, and bonds the wires 20 together, with two ends of the tape 15 being tied.

Figure 3:
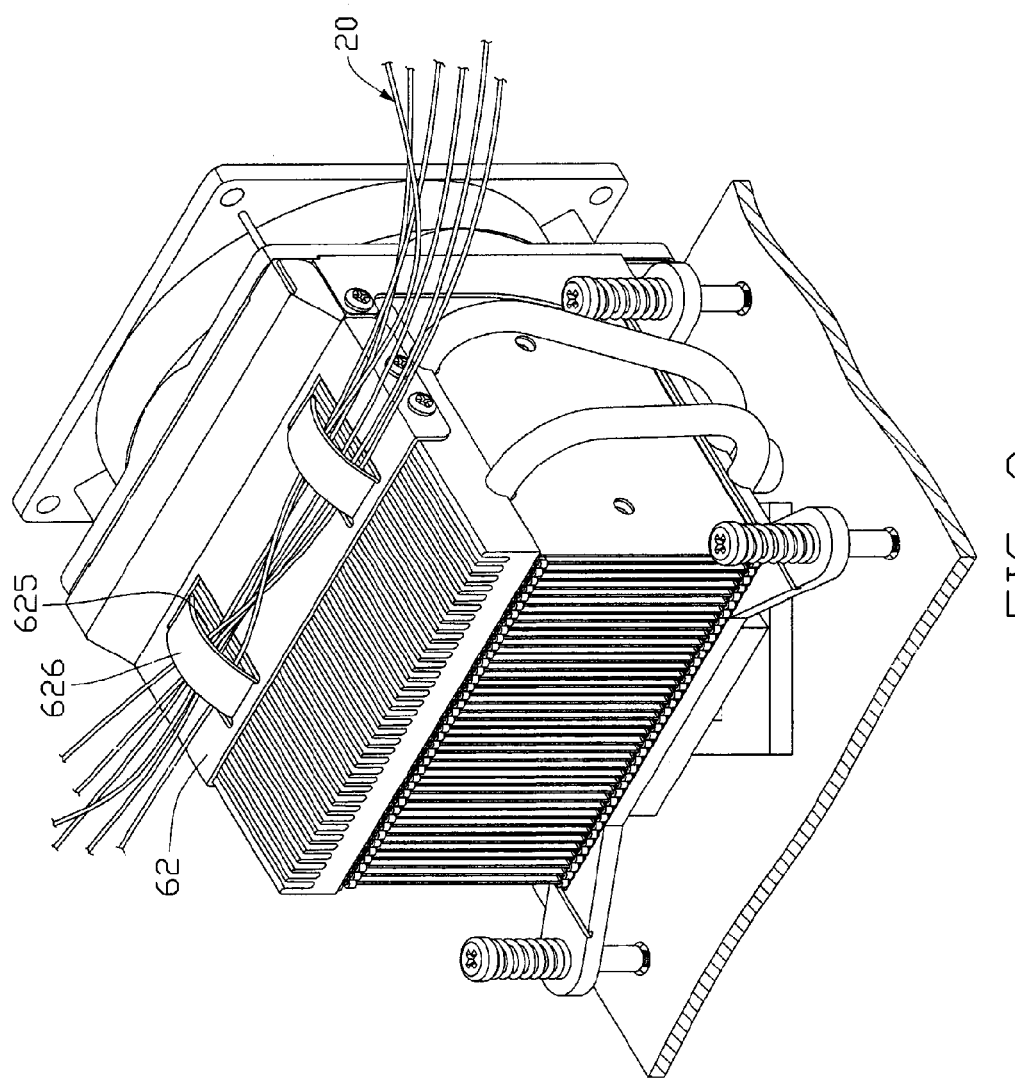
FIG. 3 is an assembled view of a heat dissipation device according to a second embodiment.

FIG. 3 shows a heat dissipation device in accordance with a second embodiment. The heat dissipation device of the second embodiment is similar to that of the previous preferred embodiment. However, a bridge 626 replaces the bridge 624 of the previous preferred embodiment. One of two opposite ends of the bridge 626 is disconnected with the mounting plate 62 such that the wires 20 directly slide through the receiving room 625 from a cutout defined between the end of the bridge 626 and the mounting plate 62, whereby the wires 20 are fixedly pressed by the bridges 626. This ensures that the wires 20 are securely bound together and not loosened by vibration. This also ensures that the inside of the computer enclosure is tidy.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device for use in a computer enclosure, the computer enclosure having a group of wires therein, the heat dissipation device, comprising:
    a heat sink assembly comprising a main heat sink, an auxiliary heat sink and a heat pipe thermally connecting the main and auxiliary heat sinks, the main heat sink comprising a heat spreader and a plurality of first fins upwardly disposed on the heat spreader, the auxiliary heat sink comprising a plate mounted onto a top of the first fins and a plurality of second fins upwardly disposed on the plate, the heat pipe comprising an evaporating portion sandwiched between the heat spreader and the first fins, a condensing portion sandwiched between the plate and the top of the first fins, wherein the plate is parallel to the heat spreader;
    a fan mounted on a front side of the heat sink assembly, a top of the fan positioned above a top of the heat sink assembly; and
    a wire fixture configured for fixing the wires thereto, the wire fixture comprising a mounting plate positioned on the top of the heat sink assembly, a faceplate parallel to the mounting plate and in alignment with the top of the fan, and a baffle plate obliquely interconnecting the mounting plate and the faceplate, the mounting plate having a bridge protruding therefrom to form a receiving room below the bridge, the bridge helping the wire fixture to fix the wires thereto, a pair of tabs extending perpendicularly and downwardly from two opposite front ends of the faceplate and engaging with corresponding portions of the fan, a pair of lateral walls parallel to the first and second fins and extending perpendicularly and downwardly from two opposite lateral ends of the mounting plate to engage with two opposite outmost second fins of the auxiliary heat sink;
    wherein the wire fixture is so configured as to block one portion of the airflow generated by the fan from dissipating from the top of the heat sink assembly, thus ensuring that the airflow can adequately blow to the fins to enhance the heat dissipating performance of the heat dissipation device.

2. The heat dissipation device as described in claim 1, wherein the bridge has an arc shaped configuration.

3. The heat dissipation device as described in claim 1, wherein the receiving room is defined between the bridge and a top of the heat sink assembly.

4. The heat dissipation device as described in claim 1, wherein the bridge has two opposite ends connecting with the mounting plate.

5. The heat dissipation device as described in claim 4, wherein a tape collecting the wires together passes through the receiving room, with two ends of the tape being tied.

6. The heat dissipation device as described in claim 1, wherein the bridge has two opposite ends, and one of the ends is disconnected from the mounting plate to form a cutout between the one of the ends and the mounting plate.

7. The heat dissipation device as described in claim 6, wherein the wires directly slide through the receiving room from the cutout and are fixedly pressed by the bridge.

8. A heat dissipation device for a computer enclosure, comprising:
    a heat spreader for being mounted to a printed circuit board and thermally connecting with a heat source of the printed circuit board;
    a heat sink mounted on the heat spreader,
    a fan mounted on the heat sink for driving an airflow through the heat sink;
    a fan cover mounted on the heat sink, and comprising a mounting plate engaging with a top of the heat sink, a faceplate engaging with the fan and mounting the fan to a front face of the heat sink, and a baffle plate slantwise and upwardly extending from the mounting plate to connect with the faceplate;
    a wire fixture formed on the fan cover to collect wires together in the computer enclosure to the heat dissipation device.

9. The heat dissipation device as described in claim 8, wherein the wire fixture comprises a bridge projecting from the mounting plate towards a direction away from the heat sink to form a receiving room between the bridge and a top of the heat sink.

10. The heat dissipation device as described in claim 9, wherein the bridge has an arc shaped configuration.

11. The heat dissipation device as described in claim 9, wherein the bridge has two opposite ends connecting with the mounting plate, a tape is tied to the bridge and the wires are collected by the tape.

12. The heat dissipation device as described in claim 9, wherein the bridge has two opposite ends, and one of the ends is disconnected from the mounting plate to form a cutout between the one of the ends and the mounting plate, the wires being collected by the bridge.

* * * * *